(12) United States Patent
Ho et al.

(10) Patent No.: US 10,950,291 B1
(45) Date of Patent: Mar. 16, 2021

(54) APPARATUSES AND METHODS TO PERFORM DUTY CYCLE ADJUSTMENT WITH BACK-BIAS VOLTAGE

(71) Applicant: Micron Technology, Inc., Boise, ID (US)

(72) Inventors: Michael V. Ho, Allen, TX (US); Myung Ho Bae, McKinney, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/661,784

(22) Filed: Oct. 23, 2019

(51) Int. Cl.
 *G11C 11/40* (2006.01)
 *G11C 11/4076* (2006.01)
 *G11C 11/4074* (2006.01)
 *G11C 11/408* (2006.01)
 *H03K 3/017* (2006.01)

(52) U.S. Cl.
 CPC ...... *G11C 11/4076* (2013.01); *G11C 11/4074* (2013.01); *G11C 11/4087* (2013.01); *H03K 3/017* (2013.01)

(58) Field of Classification Search
 CPC ............ G11C 11/4074; G11C 11/4076; G11C 11/4087; H03K 3/017
 See application file for complete search history.

(56) References Cited

U.S. PATENT DOCUMENTS

2007/0139098 A1* 6/2007 Klass ............... H03K 19/00384
 327/534
2009/0206900 A1* 8/2009 Song .................... H03K 5/1565
 327/175

FOREIGN PATENT DOCUMENTS

KR 100897296 B1 * 5/2009

* cited by examiner

*Primary Examiner* — Jay W. Radke
(74) *Attorney, Agent, or Firm* — Dorsey & Whitney LLP (57) ABSTRACT

An exemplary semiconductor device includes a clock generator circuit configured to generate a clock signal, and a duty cycle adjustment circuit configured to receive the clock signal. The duty cycle adjustment circuit includes an adjuster circuit configured to receive a back-bias voltage and to adjust a duty cycle of the clock signal based on the back-bias voltage to provide an output clock signal.

21 Claims, 6 Drawing Sheets

APPARATUSES AND METHODS TO PERFORM DUTY CYCLE ADJUSTMENT WITH BACK-BIAS VOLTAGE

BACKGROUND OF THE INVENTION

High data reliability, high speed of memory access, low power, and reduced chip size are features that are demanded from semiconductor memory. As clock speeds increase, timing margins become tighter to accommodate the increased speeds and reliably interface with external devices. Within a semiconductor device, process, voltage, or temperature (PVT) variation may cause variation in operational characteristics of circuit components, which may affect rise and fall times of signal transitions. With the smaller timing margins, even small timing variations can negatively impact reliability of the semiconductor memory. Conventional circuitry for adjusting clock signal duty cycles may be insufficient to compensate for PVT-induced variation.

DETAILED DESCRIPTION

Certain details are set forth below to provide a sufficient understanding of embodiments of the present disclosure. However, it will be clear to one skilled in the art that embodiments of the present disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Some of the material described in this disclosure includes circuitry of a semiconductor device that include duty cycle adjustment circuitry that uses back-bias voltage to reduce variance in delay step sizes at process corners. In some examples, a semiconductor device may include duty cycle circuitry to adjust a duty cycle of an internal clock signal that is derived from an external clock signal. Additionally or alternatively, the semiconductor device may include a clock tree at an input/output circuit that includes individual duty cycle adjustment circuitry for each output terminal, as well as for a data strobe signal. Some of all of the duty cycle adjustment circuitry may include step generators that provide small step sizes (e.g., on the order of less than ten picoseconds, such as two, three, four, etc., picoseconds) to finely adjust a duty cycle of a clock signal, as the clock signal may operate at a high frequency. However, PVT-induced variation in operational characteristics of duty cycle adjustment circuitry may cause these step sizes to vary by as much as 10, 15, or 20 percent or more from an expected value. These variations may result in smaller windows for accurately transmitting data to output terminals of a semiconductor device. Accordingly, an example semiconductor device may apply a back-bias voltage the step generators to normalize timing characteristics of delay components of duty cycle adjustment circuits. The back bias voltage may be determined by testing characteristics of the step generators. In some examples, the back bias voltage may be determined during production or in operation (e.g., at power up or periodically/in response to some event during normal operation), etc. Using back bias voltage to normalize step sizes caused by PVT variance may reduce variation in timing of provision of output data and other signals to data terminals.

Figure 1:
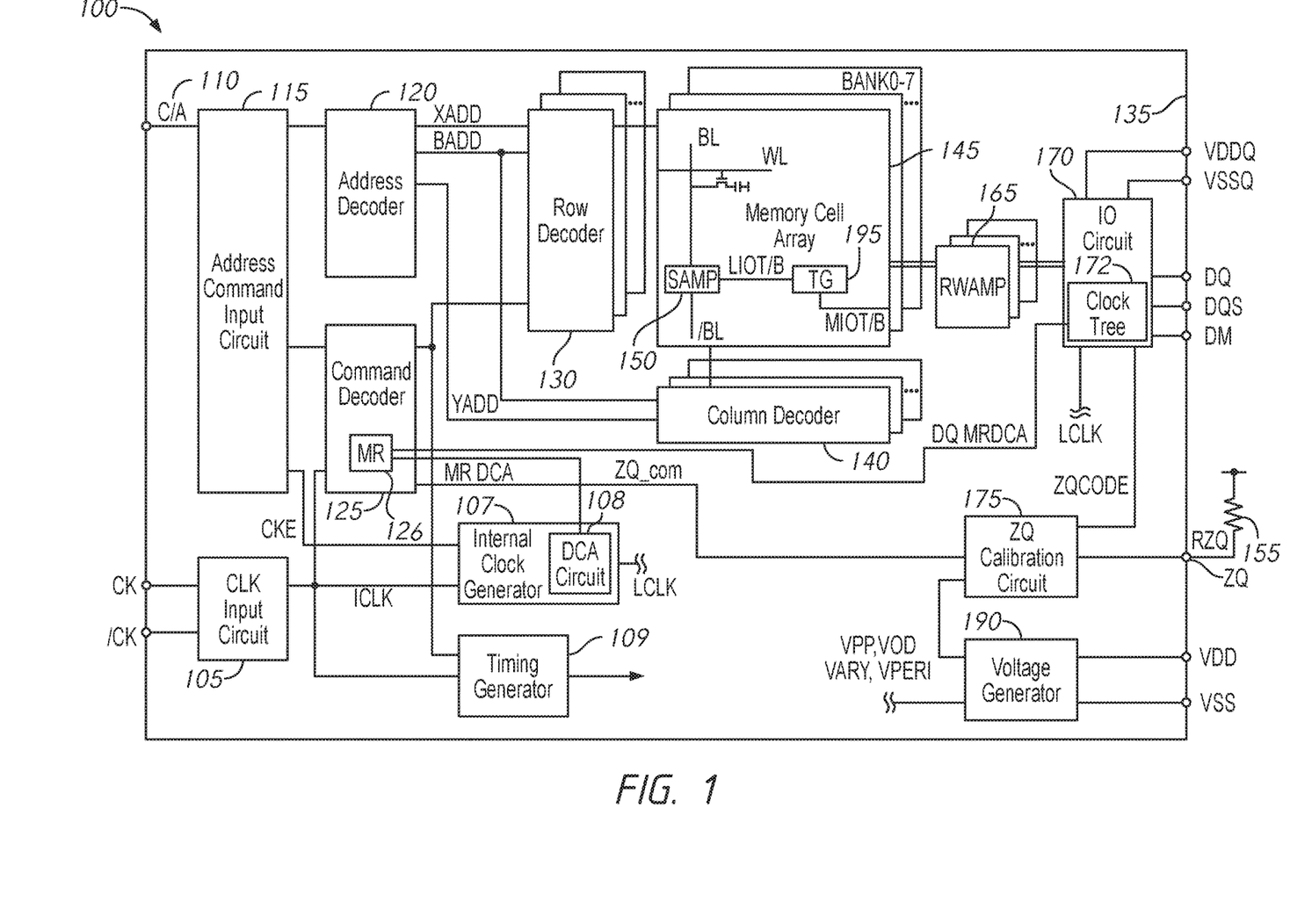
FIG. 1 is a block diagram of a semiconductor device in accordance with an embodiment of the disclosure.

FIG. 1 is a schematic block diagram of a semiconductor device 100, in accordance with an embodiment of the present disclosure. For example, the semiconductor device 100 may include a chip 135 and a ZQ resistor (RZQ) 155. The chip 135 may include a clock input circuit 105, an internal clock generator 107, a DCA circuit 108, a timing generator 109, an address command input circuit 115, an address decoder 120, a command decoder 125, a mode register 126, a plurality of row decoders 130, a memory cell array 145 including sense amplifiers 150 and transfer gates 195, a plurality of column decoders 140, a plurality of read/write amplifiers 165, an input/output (I/O) circuit 170, a clock tree 172, the ZQ resistor (RZQ) 155, a ZQ calibration circuit 175, and a voltage generator 190. The semiconductor device 100 may include a plurality of external terminals including address and command terminals coupled to command/address bus 110, clock terminals CK and /CK, data terminals DQ, DQS, and DM, power supply terminals VDD, VSS, VDDQ, and VSSQ, and a calibration terminal ZQ. The chip 135 may be mounted on a substrate, for example, a memory module substrate, a mother board or the like.

The memory cell array 145 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BL. The number of banks BANK0-N may include 2, 4, 8, 16, or any other number of banks. Each of the banks BANK0-N may divided into two or more memory planes (e.g., column planes). In some examples, each of the banks BANK0-N may include 2, 4, 8, 16, 32, etc., column planes. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and provide generate various internal command signals. For example, the internal command signals may include a row command signal to select a word line, a column command signal, such as a read command or a write command, to select a bit line, a mod register setting command MRS that may cause mode register settings to be stored at the mode register 126, and a ZQ calibration command ZQ_com that may activate the ZQ calibration circuit 175. In some examples, the mode register 126 may store duty cycle adjustment (DCA) values for the DCA circuit 108 and for duty cycle circuitry of the clock tree 172. In an example, the clock tree 172 may be adjusted on a per-data terminal DQ basis, with the mode register 126 may storing an individual DCA value for each data terminal DQ.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, together with a data strobe signal at DQS and/or a data mask signal at DM. Similarly, when the write command is issued and a row address and a column address are timely supplied with the write command, and then the input/output circuit 170 may receive write data at the data terminals DQ, together with a data strobe signal at DQS and/or a data mask signal at DM and provide the write data via the read/write amplifiers 165 to the memory cell array 145. Thus, the write data may be written in the memory cell designated by the row address and the column address.

In some examples, the IO circuitry 170 may include a clock tree 172 that distributes internal clock signals LCLKT/B to output buffers in order to control output timing of read data to the data terminals DQ. In some examples, the clock tree 172 may include individual DCA circuits for each data terminal DQ and DQS to independently adjust a duty cycle of the internal clock signals LCLKT/B used to control output buffers to provide read data and a data strobe to the data terminals DQ and DQS. In other examples, the clock tree 172 may include a single DCA circuit that is used collectively within the clock tree 172 to control timing. In some examples, the clock tree 172 may receive DQ mode register DCA settings DQ MR DCA from the mode register 126 to configure each of the DCA circuits of the clock tree 172. The DQ MR DCA settings may be received via an external controller, or may be set internally by the semiconductor device 100. The DCA circuits of the clock tree 172 may also receive one or more back-bias voltages to reduce variance in delay step sizes at process corners of step generators of the DCA circuits of the clock tree 172 that are controlled by the DQ MR DCA signal. The step generators that may provide small, incremental or decremental adjustments to signal transitions of a clock signal to adjust a duty cycle. In some examples the target duty cycle may be to 50-50. In the example of the LCKLT and LCLKB signals, the duty cycle may be measured from the rising edge of the LCLKT signal to the rising edge of the LCLKB signal. For high speed clocks, the step sizes may be on the order of less than ten picoseconds, such as two, three, four, etc., picoseconds, in some examples. With these small step sizes, PVT-induced variation in operational characteristics of the step generators of the DCA circuits of the clock tree 172 may cause the step sizes to vary by as much as 10, 15, or 20 percent or more from an expected value. The variations may result in clock signals used to control timing of output of the read data and a data strobe to the data terminals DQ and DQS having significant duty cycle variance. By applying one or more back-bias voltages VBBH/L to the step generators of the DCA circuits of the clock tree 172, timing characteristics of the step generators may be normalized across various differences in PVT. Each of the one or more back-bias voltages VBBH/L may include a supply voltage (e.g., VDD or VSS, respectively) adjusted by a bias voltage amount determined by a variation in timing characteristics from a target timing characteristic. Thus, the one or more back-bias voltages VBBH/L may be determined by testing characteristics of the clock tree 172. In some examples, the one or more back-bias voltages VBBH/L may be determined during production or in operation (e.g., at power up or periodically/in response to some event during normal operation), etc. Using the one or more back-bias voltages VBBH/L to normalize step sizes caused by PVT variance may reduce variation in timing of provision of read data and data strobe signals to the data terminals DQ and DQS.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate internal clock signals LCLKT/B based on the received internal clock signal ICLK and a clock enable signal CKE from the address/command input circuit 115. The internal clock signals LCLKT/B may include two clock signals (LCLKT and LCLKB) that are 180 degrees out of phase from one another. The internal clock generator 107 may provide the internal clock signals LCLKT/B to the IO circuit 170 and a timing generator 109. The timing generator 109 may receive the internal clock signal ICLK and generate various internal clock signals.

Although not limited thereto, a DLL circuit to control clock signal transition timing and/or a DCA circuit 108 to control duty cycle of a generated clock signal may be implemented in the internal clock generator 107 to generate the internal clock signals LCLKT/B. In some examples, the DCA circuit 108 may receive mode register DCA settings MR DCA from the mode register 126 to configure the DCA circuit 108. The DCA circuit 108 may also receive one or more back bias voltages to reduce variance in delay step sizes at process corners of step generators of the DCA circuit 108 that are controlled by the MR DCA settings. The MR DCA settings may be received via an external controller, or may be set internally by the semiconductor device 100. The step generators that may provide small, incremental or decremental adjustments to signal transitions of a clock signal to adjust a duty cycle. In some examples the target duty cycle may be to 50-50. In the example of the LCKLT and LCLKB signals, the duty cycle may be measured from the rising edge of the LCLKT signal to the rising edge of the LCLKB signal. For high speed clocks, the step sizes may be on the order of less than ten picoseconds, such as two, three, four, etc., picoseconds, in some examples. With these small step sizes, PVT-induced variation in operational characteristics of the step generators of the DCA circuit 108 may cause the step sizes to vary by as much as 10, 15, or 20 percent or more from an expected value. The variations may result the internal clock signals LCLKT/B having significant duty cycle variance. By applying one or more back bias voltages VBBH/L to the step generators of the DCA circuit 108, timing characteristics of the step generators may be normalized across various differences in PVT. As previously described, each of the one or more back-bias voltages VBBH/L may include a supply voltage (e.g., VDD or VSS, respectively) adjusted by a bias voltage amount determined by a variation in timing characteristics from a target timing characteristic. Thus, the one or more back bias voltages VBBH/L may be determined by testing characteristics of the DCA circuit 108. In some examples, the one or more back bias voltages VBBH/L may be determined during production or in operation (e.g., at power up or periodically/in response to some event during normal operation), etc. Using the one or more back bias voltages VBBH/L to normalize step sizes caused by PVT variance may reduce variation in timing of provision of output data and other signals to data terminals.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170 and the ZQ calibration circuit 175. In some examples, the voltage generator circuit 190 may be configured to generate the one or more back-bias voltages VBBH/L based on a supply voltage (e.g., VDD or VSS, respectively) adjusted by a bias voltage amount determined by a variation in timing characteristics from a target timing characteristic or circuitry of the semiconductor device 100.

The calibration terminal ZQ of the semiconductor memory device 100 may be coupled to the ZQ calibration circuit 175. The ZQ calibration circuit 175 may perform a calibration operation with reference to an impedance of the ZQ resistor (RZQ) 155. In some examples, the ZQ resistor (RZQ) 155 may be mounted on a substrate that is coupled to the calibration terminal ZQ. For example, the ZQ resistor (RZQ) 155 may be coupled to a power supply voltage (VDDQ). An impedance code ZQCODE obtained by the calibration operation may be provided to the IO circuit 170, and thus an impedance of an output buffer (not shown) included in the IO circuit 170 is specified.

Figure 2:
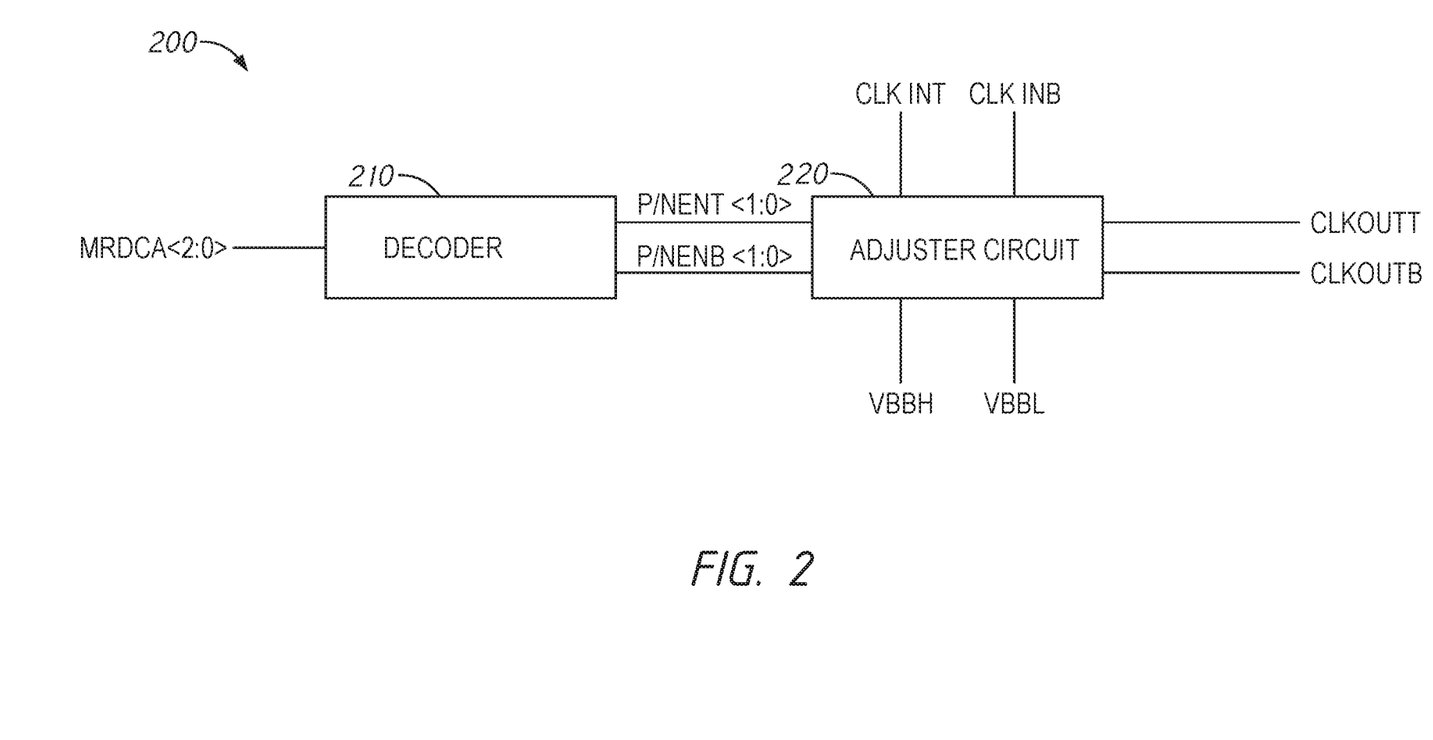
FIG. 2 is a schematic block diagram of a DCA circuit, in accordance with an embodiment of the present disclosure.

FIG. 2 is a schematic block diagram of a DCA circuit 200, in accordance with an embodiment of the present disclosure. For example, the DCA circuit 200 may include a decoder 210 coupled to a DCA adjuster 220. The DCA circuit 108 and/or any of the DCA circuits of the clock tree 172 of FIG. 1 may implement-include the DCA circuit 200, in some examples.

The decoder 210 may be configured to receive mode register DCA settings MRDCA<2:0> from a mode register (e.g., the mode register 126 of FIG. 1). The decoder 210 may decode the MRDCA<2:0> settings to provide duty cycle adjustment enable signals P/NENT<1:0> and P/NENB<1:0> to the DCA adjuster 220.

The DCA adjuster 220 may receive a pair of input clock signals CLKINT and CLKINB, the P/NENT<1:0> and P/NENB<1:0> signals, and one or both of back-bias voltages VBBH and VBBL. The VBBH and the VBBL voltages may be based on internal voltages, but may include a small bias to adjust timing characteristics of step generators of the DCA adjuster 220. It is appreciated that the DCA adjuster 220 may also receive other, unbiased voltages, such as a VDD voltage, a VSS voltage, VPERI, etc. to control operation of the DCA adjuster 220 without departing from the scope of the disclosure. These voltages are omitted for brevity. Each of the VBBH and VBBL voltages may include a supply voltage (e.g., VDD or VSS, respectively) adjusted by a bias voltage amount determined by a variation in timing characteristics from a target timing characteristic. For example, the VBBH voltage may be set to the VDD voltage plus an additional bias voltage, and/or the VBBL may be set to the VSS voltage minus an additional bias voltage. In examples where no bias is desired, the VBBH and VBBL voltages may be set to the VDD and VSS voltages, respectively. The VBBH and VBBL voltages may be determined during production testing of circuitry of the DCA adjuster 220, in some examples. In other examples, the VBBH and/or the VBBL voltages may be determined during operation, such as after a power up or when some other event is detected (e.g., timing error, etc.). The VBBH and/or the VBBL voltages may compensate for PVT variance to normalize timing characteristics of the DCA adjuster 220.

The CLKINT/B signals may correspond to clock signals received by the DCA circuit 108 and/or the LCKLT/B signals received by the clock tree 172 of FIG. 1. The DCA adjuster 220 may include circuitry to adjust a duty cycle of the CLKINT and CLKINB signals based on the P/NENT<1:0> and P/NENB<1:0> signals from the decoder 210 to provide output clock signals CLKOUTT and CLKOUTB. The CLKOUTT/B signals may correspond to the LCLKT/B signals provided by the DCA circuit 108 and/or the clock signals provided by the clock tree 172 to control output of read data and a data strobe of FIG. 1.

In operation, the DCA circuit 200 may adjust a duty cycle of the CLKINT and CLKINB signals based on the MRDCA<2:0> settings. The duty cycle of the CLKINT and CLKINB signals may correspond to the CLKINT signal rising-edge to the CLKINB rising-edge time. In some examples the target duty cycle may be to 50-50. In some examples, the DCA circuit 200 may adjust the duty cycle by slowing down a rising edge transition of the CLKINT, and then adjusting the duty cycle of the CKLINB signal based on the MRDCA<2:0> settings from a mode register. The MRDCA<2:0> settings may correspond to the MR DCA settings, one set of the DQ MR DCA settings, or a combination thereof, of FIG. 1. The decoder 210 may include logic circuitry to decode the MRDCA<2:0> settings. In this example, the MRDCA<2:0> settings include three bits, which allows selection of one DCA value of up to 16 different DCA settings. The decoder 210 may decode the MRDCA<2:0> settings to provide the P/NENT<1:0> and P/NENB<1:0> signals. The P/NENT<1:0> may correspond to adjustment of the CLKINT signal and the P/NENB<1:0> signal may correspond to adjustment of the CLKINB signal.

In some examples where the duty cycle is adjusted by adjusting the CLKINB signal against a fixed CLKINT signal, the decoder 210 may set the NENT<1:0> (e.g., b11) and the PENT<1:0> (e.g., b00) signals to slow a rising edge of the CLKINT signal to a limit of the DCA adjuster 220. The decoder 210 may use the MRDCA<2:0> settings to set the PENB<1:0> and NENB<1:0> signals to adjust rising-edge timing of the CLKINB within a range allowed by circuitry of the DCA adjuster 220.

In response to the PENT<1:0> and the NENT<1:0> signals, as well as the one or more of the VBBH and VBBL voltages, the DCA adjuster 220 may adjust a duty cycle of the CLKINT signal to provide the CLKOUTT signal. In response to the PENB<1:0> and the NENB<1:0> signals, as well as the one or more of the VBBH and VBBL voltages, the DCA adjuster 220 may adjust a duty cycle of the CLKINB signal to provide the CLKOUTB signal. In response to the NENB<1:0> signals being set to a non-zero value, the DCA adjuster 220 may increase a duty cycle by slowing transition of the CLKINB signal to provide the CLKOUTB signal. In response to the PENB<1:0> signals being set to a non-zero value, the DCA adjuster 220 may decrease a duty cycle by speeding up transition of the CLKINB signal to provide the CLKOUTB signal. The amount of slowing via the NENB<1:0> signals or the amount of speed up via the PENB<1:0> signals may be controlled by step generators of the DCA adjuster 220. The step generators may provide various incremental changes in rising edge timing of the CLKINB signal based on values of the PENB<1:0> signals and the NENB<1:0> signals. For high speed clocks, the step sizes may be on the order of less than ten picoseconds, such as two, three, four, etc., picoseconds, in some examples. With these small step sizes, PVT-induced variation in operational characteristics of the step generators of the DCA adjuster 220 may cause the step sizes to vary by as much as 10, 15, or 20 percent or more from an expected value. Thus, the VBBH and the VBBL may be configured to normalize physical characteristics and reduce variance in step generator timing. Using the one or more of the VBBH and/or the VBBL voltages to normalize step sizes caused by PVT variance may reduce variation in timing of the CLKOUTT and CLKOUTB signals.

Figure 3:
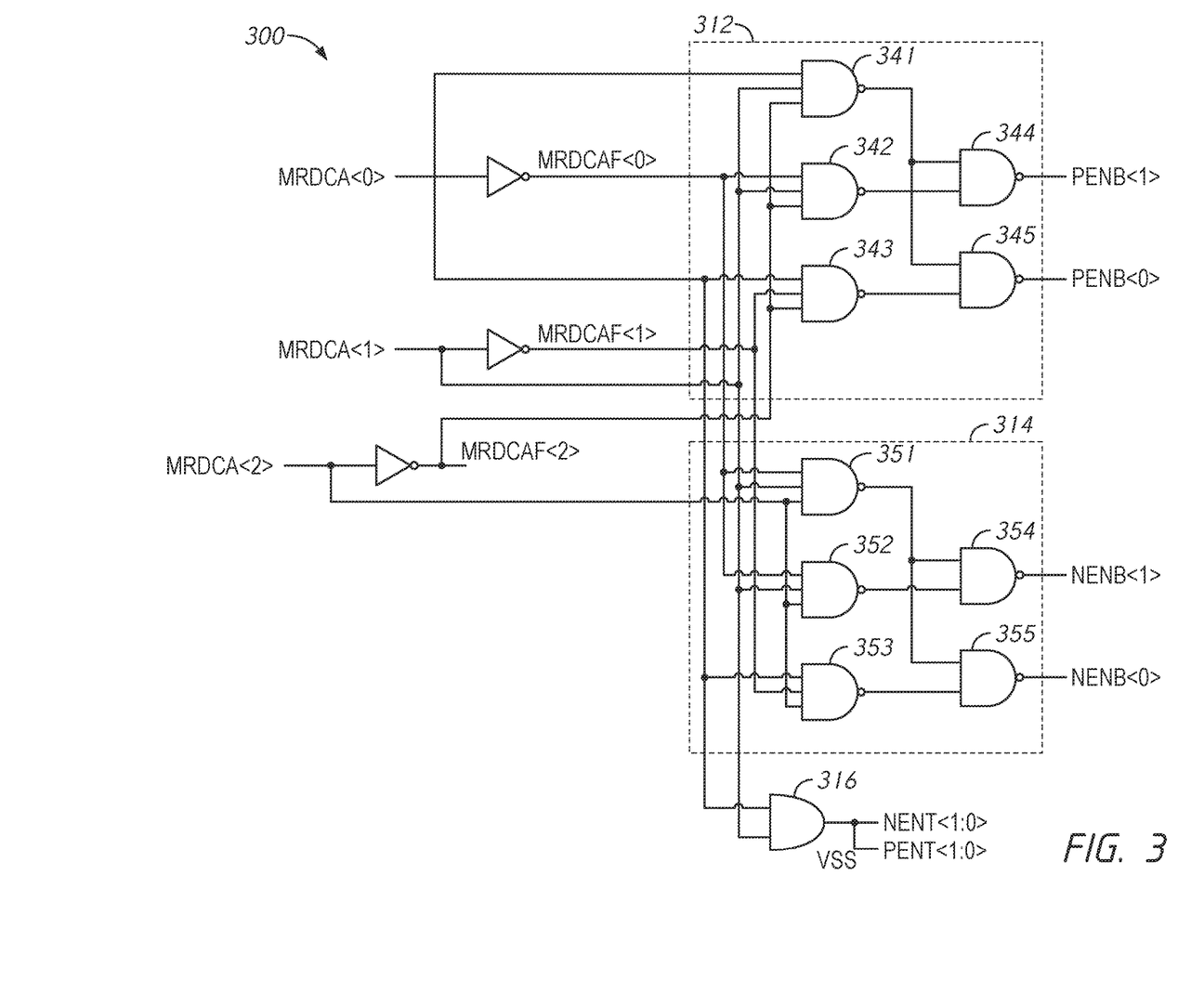
FIG. 3 is a schematic block diagram of a decoder, in accordance with an embodiment of the present disclosure.

FIG. 3 is a schematic block diagram of a decoder 300, in accordance with an embodiment of the present disclosure. For example, the decoder 300 may include a positive decoder 312, a negative decoder 314, and an OR gate 316. The DCA circuit 108 and/or any of the DCA circuits of the clock tree 172 of FIG. 1 and/or the decoder 210 of FIG. 2 may include the decoder 300, in some examples.

The decoder 300 may be configured to receive mode register DCA settings MRDCA<2:0> from a mode register (e.g., the mode register 126 of FIG. 1). The decoder 300 may decode the MRDCA<2:0> settings to provide duty cycle adjustment enable signals P/NENT<1:0> and P/NENB<1:0>. The decoder 300 may include inverters to provide complements of the MRDCA<2:0> settings.

The positive decoder 312 may include logic circuitry to provide the PENB<1:0> signals based on the MRDCA<2:0> settings. The logic circuitry may include NAND gates 341-345. The NAND gate 341 may be configured to provide an output signal to inputs of the NAND gates 344 and 345 by applying NAND logic to the MRDCA<1:0> and the MRDCAF<2> settings. The NAND gate 342 may be configured to provide an output signal to an input of the NAND gate 344 by applying NAND logic to the MRDCAF<0>, the MRDCA<1>, and the MRDCAF<2> settings. The NAND gate 343 may be configured to provide an output signal to an input of the NAND gate 345 by applying NAND logic to the MRDCA<0>, the MRDCAF<1>, and the MRDCAF<2> settings. The NAND gate 344 is configured to provide the PENB<1> signal by applying NAND logic to the outputs of the NAND gates 341 and 342. The NAND gate 344 is configured to provide the PENB<0> signal by applying NAND logic to the outputs of the NAND gates 341 and 343.

The negative decoder 314 may include logic circuitry to provide the NENB<1:0> signals based on the MRDCA<2:0> signals. The logic circuitry may include NAND gates 351-355. The NAND gate 351 may be configured to provide an output signal to inputs of the NAND gates 354 and 355 by applying NAND logic to the MRDCA<1:0> and the MRDCA<2> settings. The NAND gate 352 may be configured to provide an output signal to an input of the NAND gate 354 by applying NAND logic to the MRDCAF<0>, the MRDCA<1>, and the MRDCA<2> settings. The NAND gate 353 may be configured to provide an output signal to an input of the NAND gate 355 by applying NAND logic to the MRDCA<0>, the MRDCAF<1>, and the MRDCA<2> settings. The NAND gate 354 is configured to provide the NENB<1> signal by applying NAND logic to the outputs of the NAND gates 351 and 352. The NAND gate 354 is configured to provide the NENB<0> signal by applying NAND logic to the outputs of the NAND gates 351 and 353.

When the MRDCA<2:0> settings are all set to a low logical value, the positive decoder 312 and the negative decoder 314 may set the PENB<1:0> signals and the NENB<1:0> signals to low logical values to indicate that duty cycle adjustment is disabled. In some examples (e.g., when the CLKINT signal is fixed, and the CLKINB signal is adjusted), The OR gate 316 may set the NENT<1:0> and PENT<1:0> to values based on whether the MRDCA<2:0> settings indicate that the duty cycle adjustment is disabled. For example, when enabled (e.g., indicated by at least one of the MRDCA<1:0> settings being set), the OR gate 316 may set the NENT<1:0> signals to a high logical value by applying OR logic to the MRDCA<1:0> settings to enable a maximum slowing adjustment and may set the PENT<1:0> signals to a high logical value to disable a speeding up adjustment. In other examples, the PENT<1:0> and NENT<1:0> signals may be set using logic similar to the logic used to set the PENB<1:0> and NENB<1:0> signals to adjust a duty cycle of the CLINKT signal independently of the CLKINB signal.

The circuitry of the decoder 300 if exemplary. Thus, while the circuitry of the positive decoder 312 and the negative decoder 314 is shown as being implemented using NAND gates, other logic circuitry may be implemented without departing from the scope of the disclosure. In addition, the MRDCA<2:0> settings may include more or fewer than three bits, in some examples, without departing from the scope of the disclosure.

Figure 4:
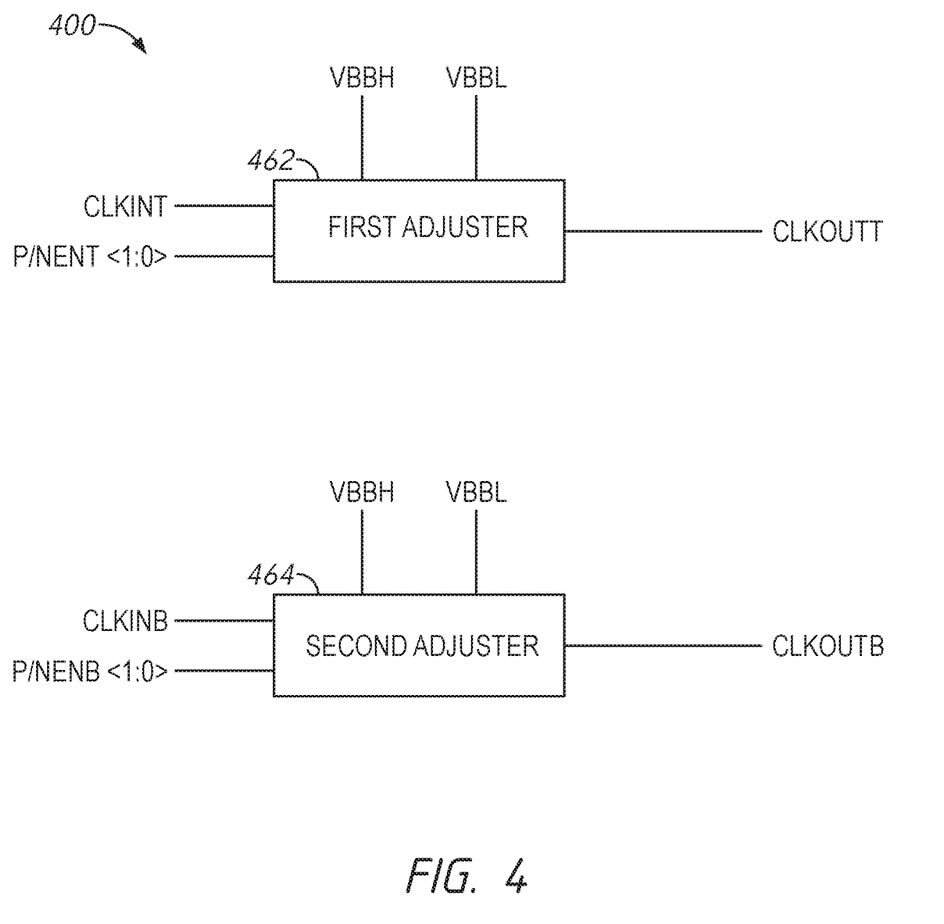
FIG. 4 is a schematic block diagram of a DCA adjuster, in accordance with an embodiment of the present disclosure.

FIG. 4 is a schematic block diagram of a DCA adjuster 400, in accordance with an embodiment of the present disclosure. For example, the DCA adjuster 400 may include a first adjuster 462 and a second adjuster 464. The DCA circuit 108 and/or any of the DCA circuits of the clock tree 172 of FIG. 1 and/or the DCA adjuster 220 of FIG. 2 may be implemented by the DCA adjuster 400, in some examples.

The first adjuster 462 may receive an input clock signal CLKINT, the P/NENT<1:0> signals (e.g., from a DCA decoder, such as the decoder 210 of FIG. 2 or the decoder 300 of FIG. 3), and one or both of back-bias voltages VBBH and VBBL. Each of the VBBH and VBBL voltages may include a supply voltage (e.g., VDD or VSS, respectively) adjusted by a bias voltage amount determined by a variation in timing characteristics from a target timing characteristic. The second adjuster 464 may receive an input clock signal CLKINB, the P/NENB<1:0> signals (e.g., from a DCA decoder, such as the decoder 210 of FIG. 2 or the decoder 300 of FIG. 3), and one or both of the back-bias voltages VBBH and VBBL. The VBBH and the VBBL voltages may be based on internal voltages, but may include a small bias to adjust timing characteristics of step generators of the first adjuster 462. It is appreciated that the first adjuster 462 and/or the second adjuster 464 may also receive other, unbiased voltages, such as a VDD voltage, a VSS voltage, VPERI, etc. to control operation of the first adjuster 462 and/or the second adjuster 464 without departing from the scope of the disclosure. These voltages are omitted for brevity. For example, the VBBH voltage may be set to the VDD voltage plus an additional bias voltage, and/or the VBBL may be set to the VSS voltage minus an additional bias voltage. In examples where no bias is desired, the VBBH and VBBL voltages may be set to the VDD and VSS voltages, respectively. The VBBH and VBBL voltages may be determined during production testing of circuitry of the DCA adjuster 400, in some examples. In other examples, the VBBH and/or the VBBL voltages may be determined during operation, such as after a power up or when some other event is detected (e.g., timing error, etc.). The VBBH and/or the VBBL voltages may compensate for PVT variance to normalize timing characteristics of the first adjuster 462 and/or the second adjuster 464.

The first adjuster 462 may include circuitry to adjust a duty cycle of the CLKINT signal based on the P/NENT<1:0> signals to provide an output clock signal CLKOUTT. The second adjuster 464 may include circuitry to adjust a duty cycle of the CLKINB signal based on the P/NENB<1:0> signals to provide an output clock signal CLKOUTB. The CLKOUTT/B signals may correspond to the LCLKT/B signals provided by the DCA circuit 108 and/or the clock signals provided by the clock tree 172 to control output of read data and a data strobe of FIG. 1, and/or the CLKOUTT/B signals of FIG. 2.

In operation, the DCA adjuster 400 may adjust a duty cycle of the CLKINT and CLKINB signals based on the P/NENT<1:0> and the P/NENB<1:0> signals. The duty cycle of the CLKINT and CLKINB signals may correspond to the CLKINT signal rising-edge to the CLKINB rising-edge time. In some examples where the duty cycle is adjusted by adjusting the CLKINB signal against a fixed CLKINT signal, the NENT<1:0> (e.g., b11) signals and the PENT<1:0> (e.g., b00) signals may be set to cause the first adjuster 462 to slow a rising edge of the CLKINT signal to a limit of the first adjuster 462. The PENB<1:0> and NENB<1:0> signals may be set to cause the second adjuster 464 to adjust rising-edge timing of the CLKINB within a range allowed by circuitry of the second adjuster 464.

In response to the PENT<1:0> and the NENT<1:0> signals, as well as the one or more of the VBBH and VBBL voltages, the first adjuster 462 may adjust a duty cycle of the CLKINT signal to provide the CLKOUTT signal. In response to the PENB<1:0> and the NENB<1:0> signals, as well as the one or more of the VBBH and VBBL voltages, the second adjuster 464 may adjust a duty cycle of the CLKINB signal to provide the CLKOUTB signal. In response to the NENB<1:0> signals being set to a non-zero value, the second adjuster 464 may increase a duty cycle by slowing transition of the CLKINB signal to provide the CLKOUTB signal. In response to the PENB<1:0> signals being set to a non-zero value, the second adjuster 464 may decrease a duty cycle by speeding up transition of the CLKINB signal to provide the CLKOUTB signal.

Both of the first adjuster 462 and the second adjuster 464 may include respective step generators that are configured to adjust rising-edge timing based on the P/NENT<1:0> signals and the P/NENB<1:0> signals, respectively. The step generators may provide various incremental changes in rising edge timing of the CLKINB signal based on values of the PENB<1:0> signals and the NENB<1:0> signals. In some examples, the step generators may include capacitors to provide the duty cycle adjustment. For high speed clocks, the step sizes may be on the order of less than ten picoseconds, such as two, three, four, etc., picoseconds, in some examples. With these small step sizes, PVT-induced variation in operational characteristics of the step generators of the first adjuster 462 and the second adjuster 464 may cause the step sizes to vary by as much as 10, 15, or 20 percent or more from an expected value. Thus, the VBBH and the VBBL may be configured to normalize physical characteristics and reduce variance in step generator timing. Using the one or more of the VBBH and/or the VBBL voltages to normalize step sizes caused by PVT variance may reduce variation in timing of the CLKOUTT and CLKOUTB signals.

Figure 5:
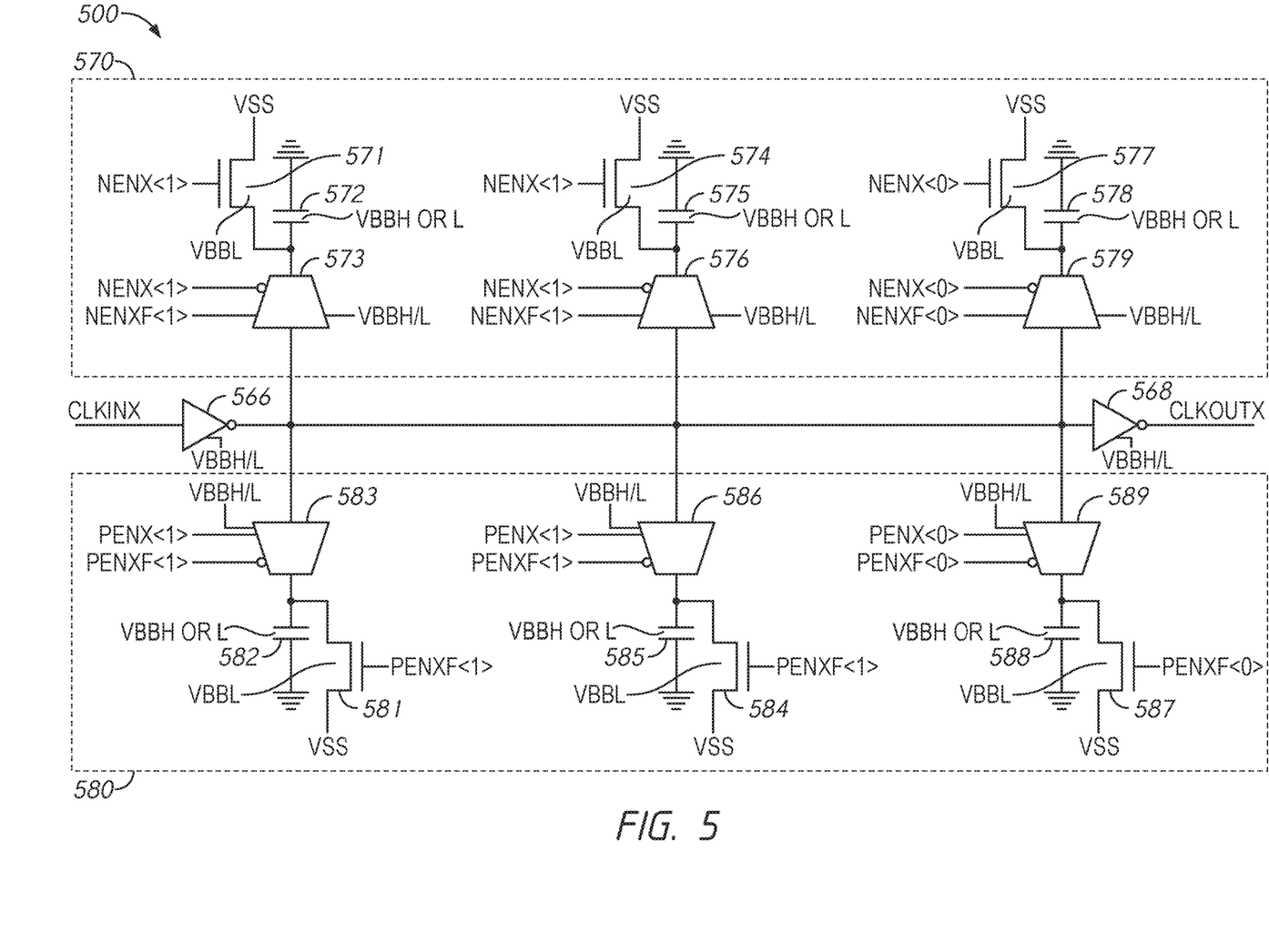
FIG. 5 is a schematic block diagram of a duty cycle adjuster, in accordance with an embodiment of the present disclosure.

FIG. 5 is a schematic block diagram of a duty cycle adjuster 500, in accordance with an embodiment of the present disclosure. For example, the duty cycle adjuster 500 may include a first set of step generators 570 and a second set of step generators 580. The DCA circuit 108 and/or any of the DCA circuits of the clock tree 172 of FIG. 1, the DCA adjuster 220 of FIG. 2, and/or one or both of the first adjuster 462 or the second adjuster 464 of FIG. 4 may be implemented by the duty cycle adjuster 500, in some examples.

The duty cycle adjuster 500 may include a first inverter 566 serially-coupled to a second inverter 568 that are configured to receive an input clock signal CLKIN and provide an output clock signal CLKOUT. The first set of step generators 570 and the second set of step generators 580 are coupled to a node between an output of the first inverter 566 and an input of the second inverter 568. Step generators of the first set of step generators 570 may be selectively-enabled to adjust a duty cycle of the CLKIN signal when coupled to the node between the output of the first inverter 566 and the input of the second inverter 568. The adjustment provided by the first set of step generators 570 may include slowing a rising-edge transition of the CKLIN signal when one or more of the step generators are enabled. Step generators of the second set of step generators 580 may be selectively-enabled step to adjust the duty cycle of the CLKIN signal when coupled to the node between the output of the first inverter 566 and the input of the second inverter 568. The adjustment provided by the second set of step generators 580 may include speeding up a rising-edge transition of the CKLIN signal when one or more of the step generators are enabled.

Each of the step generators of the first set of step generators 570 and the second set of step generators 580 may be configured to adjust a duty cycle of the CLKIN signal by a same amount. When more than one of the step generators of the either the first set of step generators 570 or the second set of step generators 580 are enabled, the duty cycle adjustment may be cumulative. Each of the step generators of the first set of step generators 570 and the second set of step generators 580 include a capacitor, a transistor, and a pass-gate. For example, a first step generator of the first set of step generators 570 includes a passgate 573 coupled in series with a capacitor 572 between the node between the output of the first inverter 566 and the input of the second inverter 568 and a VSS voltage source. The first step generator of the first set of step generators 570 further includes a transistor 571 coupled between the VSS voltage source and a node between the capacitor 572 and the passgate 573. A second step generator of the first set of step generators 570 includes a passgate 576 coupled in series with a capacitor 575 between the node between the output of the first inverter 566 and the input of the second inverter 568 and the VSS voltage source. The second step generator of the first set of step generators 570 further includes a transistor 574 coupled between the VSS voltage source and a node between the capacitor 575 and the passgate 576. A third step generator of the first set of step generators 570 includes a passgate 579 coupled in series with a capacitor 578 between the node between the output of the first inverter 566 and the input of the second inverter 568 and the VSS voltage source. The third step generator of the first set of step generators 570 further includes a transistor 577 coupled between the VSS voltage source and a node between the capacitor 578 and the passgate 579.

The first and second step generators of the first set of step generators 570 are controlled by the NENX<1> signal and an inverted NENX<1> signal NENXF<1>, where X is T or B. The third step generator of the first set of step generators 570 is controlled by the NENX<0> signal and an inverted NENX<0> signal NENXF<0>. In some examples, each step generator of the first set of step generators 570 may individually provide an equal duty cycle adjustment amount. A total duty cycle adjustment by the first set of step generators 570 is based on a sum of adjustment amounts for each enabled step generator. Thus, when the NENX<0> signal is set (e.g., to a high logical value), the passgate 579 is enabled to couple the capacitor 578 to the node between the first inverter 566 and the second inverter 567, and the transistor 577 is configured to couple a VSS voltage to a node between the passgate 579 and the capacitor 578. When the NENX<1> signal is set (e.g., to a high logical value), both of the passgate 573 and the passgate 576 are enabled to couple the capacitor 572 and the capacitor 575, respectively, to the node between the first inverter 566 and the second inverter 567, and the transistor 571 and the transistor 574 are each configured to couple the VSS voltage to a node between the capacitor 572 and the passgate 573 and to a node between the capacitor 575 and the passgate 576. Thus, when only the NENX<0> signal is set, the third step generator of the first set of step generators 570 is enabled. When only the NENX<1> signal is set, both the first and second step generators of the first set of step generators 570 are enabled. When both of the NENX<1:0> signals are set, each of the first, second, and third step generators of the first set of step generators 570 are enabled.

Similar to the first set of step generators 570, a first step generator of the second set of step generators 580 includes a passgate 583 coupled in series with a capacitor 582 between the node between the output of the first inverter 566 and the input of the second inverter 568 and a VSS voltage source. The first step generator of the second set of step generators 580 further includes a transistor 581 coupled between the VSS voltage source and a node between the capacitor 582 and the passgate 583. A second step generator of the second set of step generators 580 includes a passgate 586 coupled in series with a capacitor 585 between the node between the output of the first inverter 566 and the input of the second inverter 568 and the VSS voltage source. The second step generator of the second set of step generators 580 further includes a transistor 584 coupled between the VSS voltage source and a node between the capacitor 585 and the passgate 586. A third step generator of the second set of step generators 580 includes a passgate 589 coupled in series with a capacitor 588 between the node between the output of the first inverter 566 and the input of the second inverter 568 and the VSS voltage source. The third step generator of the second set of step generators 580 further includes a transistor 587 coupled between the VSS voltage source and a node between the capacitor 588 and the passgate 589.

The first and second step generators of the second set of step generators 580 are controlled by the PENX<1> signal and an inverted PENX<1> signal PENXF<1>, where X is T or B. The third step generator of the second set of step generators 580 is controlled by the PENX<0> signal and an inverted PENX<0> signal PENXF<0>. In some examples, each step generator of the second set of step generators 580 may individually provide an equal duty cycle adjustment amount. A total duty cycle adjustment by the second set of step generators 580 is based on a sum of adjustment amounts for each enabled step generator. Thus, when the PENX<0> signal is cleared (e.g., to a low logical value), the passgate 589 is enabled to couple the capacitor 588 to the node between the first inverter 566 and the second inverter 567, and the transistor 587 is configured to couple a VSS voltage to a node between the passgate 589 and the capacitor 588. When the PENX<1> signal is cleared (e.g., to a low logical value), both of the passgate 583 and the passgate 586 are enabled to couple the capacitor 582 and the capacitor 585, respectively, to the node between the first inverter 566 and the second inverter 567, and the transistor 581 and the transistor 584 are each configured to couple the VSS voltage to a node between the capacitor 582 and the passgate 583 and to a node between the capacitor 575 and the passgate 576. Thus, when only the PENX<0> signal is cleared, the third step generator of the second set of step generators 580 is enabled. When only the PENX<1> signal is cleared, both the first and second step generators of the second set of step generators 580 are enabled. When both of the PENX<1:0> signals are cleared, each of the first, second, and third step generators of the second set of step generators 580 are enabled.

The capacitor 572, capacitor 575, capacitor 578, capacitor 582, capacitor 585, and capacitor 588 may each be configured to have a size to cause a target duty cycle adjustment step. That is, the step amount for each step generator is based, in part, on a size of the capacitor. The target duty cycle adjustment step may be less than 10 picoseconds, such as 2-5 picoseconds, in some examples. In some examples, the target duty cycle adjustment step may be set to 3 picoseconds. In addition, the capacitor 572, capacitor 575, capacitor 578, capacitor 582, capacitor 585, and capacitor 588 may each receive one of the back-biased voltages VBBH or VBBL based on a type of circuit used for form the capacitors. For example, if the capacitor 572, capacitor 575, capacitor 578, capacitor 582, capacitor 585, and capacitor 588 each include NMOS circuitry, they may receive the back-biased voltage VBBL. Additionally or alternatively, if the capacitor 572, capacitor 575, capacitor 578, capacitor 582, capacitor 585, and capacitor 588 each include PMOS circuitry, they may receive the back-biased voltage VBBH.

As shown in FIG. 5, the passgate 573, the passgate 576, and the passgate 579 of the first set of step generators 570 may each receive one or both of the back-biased voltage VBBH/L. In addition, the transistor 571, the transistor 574, and the transistor 577 of the first set of step generators 570 may include NMOS transistors and may each receive the back-biased voltage VBBL. In other examples, the transistor 571, the transistor 574, and the transistor 577 of the first set of step generators 570 may include PMOS transistors and may each receive the back-biased voltage VBBH.

Similarly, the passgate 583, the passgate 586, and the passgate 589 of the second set of step generators 580 may each receive one or both of the back-biased voltage VBBH/L. In addition, the transistor 581, the transistor 584, and the transistor 587 of the second set of step generators 580 may include NMOS transistors and may each receive the back-biased voltage VBBL. In other examples, the transistor 581, the transistor 584, and the transistor 587 of the second set of step generators 580 may include PMOS transistors and may each receive the back-biased voltage VBBH.

Each of the VBBH and VBBL voltages may include a supply voltage (e.g., VDD or VSS, respectively) adjusted by a bias voltage amount determined by a variation in timing characteristics from a target timing characteristic. Using the one or more of the VBBH and/or the VBBL voltages to normalize step sizes of the step generators of the first set of step generators 570 and/or the second set of step generators 580 caused by PVT variance may reduce variation in timing of the CLKOUT signal.

While the first set of step generators 570 and the second set of step generators 580 each include three step generators, the duty cycle adjuster 500 may be implemented with more or fewer than three step generators per adjustment type. It is also appreciated that the duty cycle adjuster 500 may be implemented using different or additional circuit components without departing from the scope of the disclosure.

Figure 6:
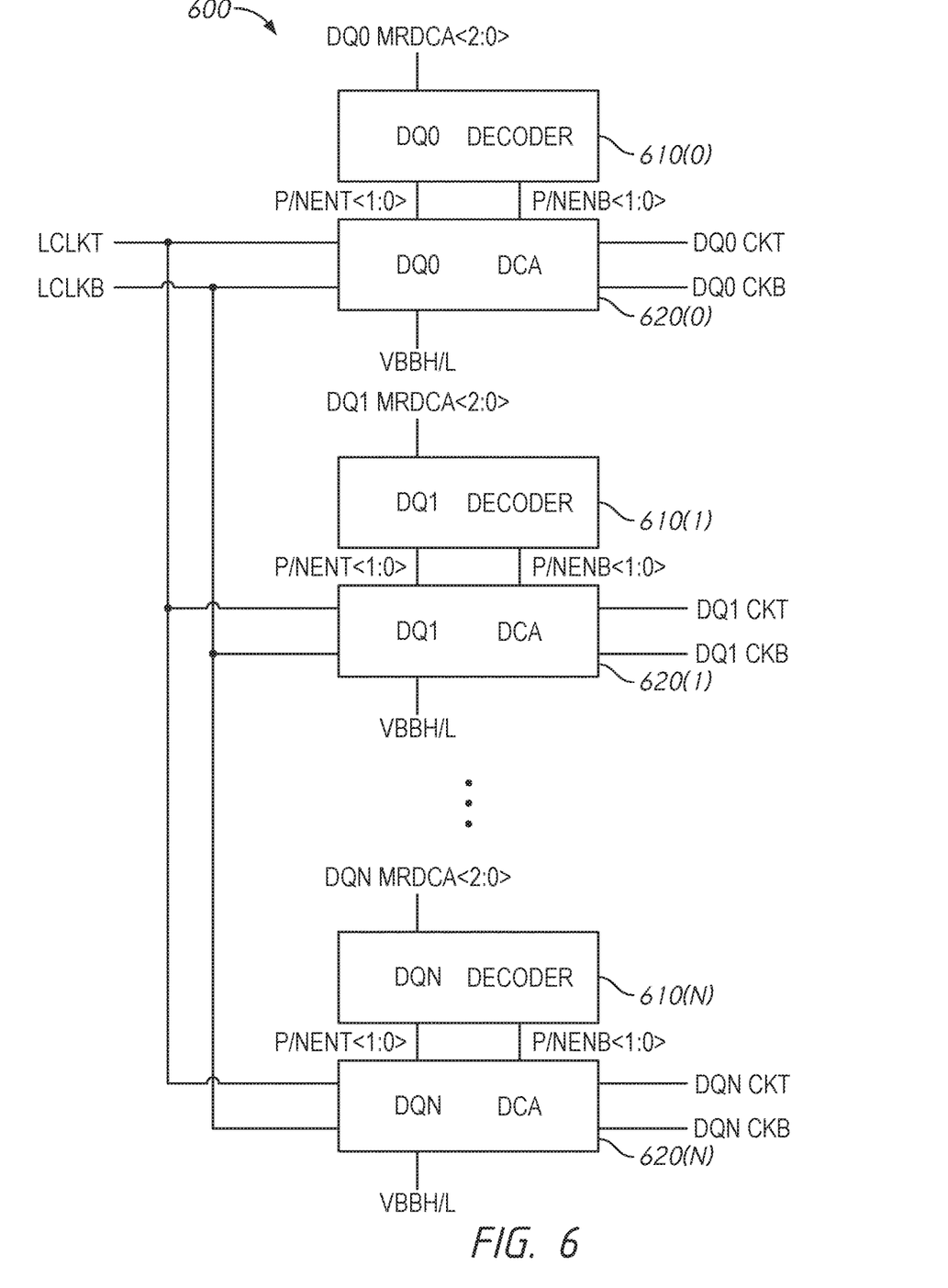
FIG. 6 is a schematic block diagram of a clock tree, in accordance with an embodiment of the present disclosure.

FIG. 6 is a schematic block diagram of a clock tree 600, in accordance with an embodiment of the present disclosure. For example, the clock tree 600 may include individual ones of decoders 610(0)-(N) coupled to individual ones of DCA adjusters 620(0)-(N). The clock tree 172 of FIG. 1 may implement the clock tree 600, in some examples.

Each of the decoders 610(0)-(N) may be configured to receive individual DQ mode register DCA settings DQOMRDCA<2:0> to DQNMRDCA<2:0>, respectively, from a mode register (e.g., the mode register 126 of FIG. 1). In an example, each of the decoders 610(0)-(N) may implement the decoder 210 of FIG. 2 and/or the decoder 300 of FIG. 3. Each of the decoders 610(0)-(N) may decode the respective DQO-NMRDCA<2:0> settings to provide respective duty cycle adjustment enable signals P/NENT<1:0> and P/NENB<1:0> to a corresponding one of the DCA adjusters 620(0)-(N).

Each of the DCA adjusters 620(0)-(N) may receive the LCLKT/B clock signals, the respective P/NENT<1:0> and P/NENB<1:0> signals, and one or both of back-bias voltages VBBH and VBBL. Each of the DCA adjusters 620(0)-(N) may implement the DCA adjuster 220 of FIG. 2, the DCA adjuster 400 of FIG. 4, and/or the duty cycle adjuster 500 of FIG. 5. The VBBH and the VBBL voltages may be based on internal voltages, but may include a small bias to adjust timing characteristics of step generators of each of the DCA adjusters 620(0)-(N). It is appreciated that each of the DCA adjusters 620(0)-(N) may also receive other, unbiased voltages, such as a VDD voltage, a VSS voltage, VPERI, etc. to control operation of each of the DCA adjusters 620(0)-(N) without departing from the scope of the disclosure. These voltages are omitted for brevity. For example, the VBBH voltage may be set to the VDD voltage plus an additional bias voltage, and/or the VBBL may be set to the VSS voltage minus an additional bias voltage. In examples where no bias is desired, the VBBH and VBBL voltages may be set to the VDD and VSS voltages, respectively. The VBBH and VBBL voltages may be determined during production testing of circuitry of the clock tree 600, in some examples. In other examples, the VBBH and/or the VBBL voltages may be determined during operation, such as after a power up or when some other event is detected (e.g., timing error, etc.). The VBBH and/or the VBBL voltages may compensate for PVT variance to normalize timing characteristics of each of the DCA adjusters 620(0)-(N).

Each of the DCA adjusters 620(0)-(N) may include circuitry to adjust a duty cycle of the LCLKT and LCLKB signals based on the P/NENT<1:0> and P/NENB<1:0> signals from the decoder 210 to provide respective DQO-N CKT and CKB output clock signals. The DQO-N CKT and CKB signals may control respective output buffers to provide data to a respective data terminal. In an example, a pair of one of the decoders 610(0)-(N) and one of the DCA adjusters 620(0)-(N) may correspond to a data strobe signal DQS.

In operation, the clock tree 600 may, on a per-data terminal basis, adjust a duty cycle of the LCLKTB signals based on the respective DQO-NMRDCA<2:0> settings. The duty cycle of the LCLKTB signals may correspond to the LCLKT signal rising-edge to the LCLKB rising-edge time. In some examples the target duty cycle may be to 50-50. In some examples, each of the DCA adjusters 620(0)-(N) may adjust the duty cycle by slowing down a rising edge transition of the LCLKT, and then adjusting the duty cycle of the LCLKB signal based on the respective DQO-NMRDCA<2:0> settings from a mode register.

Each of the decoders 610(0)-(N) may include logic circuitry to decode the respective DQO-NMRDCA<2:0> settings. In this example, the DQO-NMRDCA<2:0> settings include three bits, which allows selection of one DCA value of up to 16 different DCA settings. Each of the decoders 610(0)-(N) may decode the respective DQO-NMRDCA<2:0> settings to provide the respective P/NENT<1:0> and PNENB<1:0> signals. The respective P/NENT<1:0> may correspond to adjustment of the LCLKT signal and the P/NENB<1:0> signals may correspond to adjustment of the LCLKB signal.

In some examples where the duty cycle is adjusted by adjusting the LCLKB signal against a fixed LCLKT signal, each of the DCA adjusters 620(0)-(N) may set the respective NENT<1:0> (e.g., b11) and the respective PENT<1:0> (e.g., b00) signals to slow a rising edge of the LCLKT signal to a delay limit. Each of the decoders 610(0)-(N) may set the respective PENB<1:0> and NENB<1:0> signals based on the respective DQO-NMRDCA<2:0> settings to adjust rising-edge timing of the LCKLB signal within a range allowed by circuitry of each of the DCA adjusters 620(0)-(N).

In response to the respective PENT<1:0> and the NENT<1:0> signals, as well as the one or more of the VBBH and VBBL voltages, each of the DCA adjusters 620(0)-(N) may adjust a duty cycle of the LCLKT signal to provide the respective DQO-N CKT signal. In response to the PENB<1:0> and the NENB<1:0> signals, as well as the one or more of the VBBH and VBBL voltages, each of the DCA adjusters 620(0)-(N) may adjust a duty cycle of the LCLKB signal to provide the respective DQO-N CKB signal. In response to the respective NENB<1:0> signals being set to a non-zero value, each of the DCA adjusters 620(0)-(N) may increase a duty cycle by slowing transition of the LCLKB signal to provide the respective DQO-N CKB signal. In response to the respective PENB<1:0> signals being set to a non-zero value, each of the DCA adjusters 620(0)-(N) may decrease a duty cycle by speeding up transition of the LCKLB signal to provide the respective DQO-N CKB signal. The amount of slowing via the respective NENB<1:0> signals or the amount of speed up via the respective PENB<1:0> signals may be controlled by respective step generators of each of the DCA adjusters 620(0)-(N). The step generators may provide various incremental changes in rising edge timing of the CLKINB signal based on values of the respective PENB<1:0> signals and the respective NENB<1:0> signals. For high speed clocks, the step sizes may be on the order of less than ten picoseconds, such as two, three, four, etc., picoseconds, in some examples. With these small step sizes, PVT-induced variation in operational characteristics of the step generators of each of the DCA adjusters 620(0)-(N) may cause the step sizes to vary by as much as 10, 15, or 20 percent or more from an expected value. Thus, the VBBH and the VBBL may be configured to normalize physical characteristics and reduce variance in step generator timing. Using the one or more of the VBBH and/or the VBBL voltages to normalize step sizes caused by PVT variance may reduce variation in timing of the CLKOUTT and CLKOUTB signals.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising;
    a clock generator circuit configured to generate a clock signal; and
    a duty cycle adjustment circuit configured to receive the clock signal, wherein the duty cycle adjustment circuit comprises an adjuster circuit configured to receive a back-bias voltage and to adjust a duty cycle of the clock signal based on the back-bias voltage to provide an output clock signal, wherein the adjuster circuit includes a first step generator configured to receive the back-bias voltage, and wherein the first step generator is selectively enabled by a signal different from the clock signal to adjust the duty cycle of the clock signal by a first amount based on the back-bias voltage.

2. The apparatus of claim 1, wherein the first step generator is selectively enabled based on a mode register setting.

3. The apparatus of claim 1, wherein the adjuster circuit further includes a second step generator that is configured to receive the back-bias voltage, wherein the second step generator is selectively enabled independently of the first step generator to adjust the duty cycle of the clock signal by a second amount based on the back-bias voltage.

4. The apparatus of claim 3, wherein the second amount of adjustment to the duty cycle of the clock signal by the second step generator and the first amount of adjustment to the duty cycle of the clock signal by the first step generator are equal.

5. The apparatus of claim 3, wherein, when both the first step generator and the second step generator are enabled, a total adjustment to the duty cycle of the clock signal is a sum of the second amount of adjustment by the second step generator and the first amount of adjustment by the first step generator.

6. The apparatus of claim 1, wherein the back-bias voltage includes a supply voltage adjusted by a bias voltage amount.

7. The apparatus of claim 6, wherein the bias voltage amount is based on a variance in a timing characteristic of the adjuster circuit caused by process, voltage, or temperature variance.

8. The apparatus of claim 6, wherein the supply voltage is one of a VDD voltage or a VSS voltage.

9. The apparatus of claim 1, further comprising an input/output circuit coupled to first and second data terminals and including a clock tree, wherein the clock tree comprises the duty cycle adjustment circuit and a second duty cycle adjustment circuit, wherein the second duty cycle adjustment circuit is configured to receive the clock signal and to independently adjust the duty cycle of the clock signal based on the back bias voltage to provide a second output clock signal, wherein the output clock signal controls timing of provision of first output data to the first data terminal and the second output clock signal controls timing of provision of second output data to the second data terminal.

10. An apparatus, comprising:
    a clock generator circuit configured to generate a clock signal; and
    a duty cycle adjustment circuit configured to receive the clock signal, wherein the duty cycle adjustment circuit comprises an adjuster circuit configured to receive a back-bias voltage and to adjust a duty cycle of the clock signal based on the back-bias voltage to provide an output clock signal, wherein the duty cycle adjustment circuit further includes a decoder circuit configured to decode a mode register setting to provide a control signal to the adjuster circuit, wherein the adjuster circuit is further configured to adjust the duty cycle of the clock signal based on the control signal.

11. A memory comprising:
    a duty cycle adjustment circuit comprising:
    an adjuster circuit configured to receive a back-bias voltage, a clock signal, and a control signal, wherein the adjustor circuit is configured to adjust a duty cycle of the clock signal based on the back-bias voltage and the control signal to provide an output clock signal; and
    a decoder circuit configured to receive a mode register setting and to decode the mode register setting to provide the control signal to the adjustor circuit, wherein an amount of the adjustment of the duty cycle of the clock signal is based on a value of the control signal.

12. The memory of claim 11, wherein the back-bias voltage includes a supply voltage adjusted by a bias voltage amount.

13. The memory of claim 12, wherein the bias voltage amount is based on a variance in a timing characteristic of the adjuster circuit caused by process, voltage, or temperature variance.

14. The memory of claim 12, wherein the supply voltage is one of a VDD voltage or a VSS voltage.

15. The memory of claim 11, wherein the adjuster circuit includes a step generator configured to receive the back-bias voltage, wherein the step generator is enabled by the control signal to adjust the duty cycle of the clock signal by an amount based on the back-bias voltage.

16. The memory of claim 11, wherein the step generator comprises a passgate coupled in series with a capacitor, wherein the step generator is configured to adjust the duty cycle of the clock signal by the amount further based on a size of the capacitor.

17. A method comprising:
   receiving, at a duty cycle adjustment circuit, a mode register setting, a clock signal, and a back-bias voltage, wherein the back-bias voltage includes a supply voltage adjusted by a bias voltage amount;
   decoding the mode register setting to determine a duty cycle adjustment amount;
   adjusting a duty cycle of the clock signal based on the determined duty cycle adjustment amount and the back-bias voltage to provide an output clock signal.

18. The method of claim 17, further comprising enabling a first step generator to adjust the duty cycle of the clock signal based on the determined duty cycle adjustment amount.

19. The method of claim 18, further comprising enabling a second step generator to further adjust the duty cycle of the clock signal based on the determined duty cycle adjustment amount.

20. The method of claim 17, further comprising determining the bias voltage amount is based on a variance in a timing characteristic of the duty cycle adjustment circuit caused by process, voltage, or temperature variance.

21. The method of claim 17, wherein the supply voltage is one of a VDD voltage or a VSS voltage.

* * * * *